(12) United States Patent
Libralesso et al.

(10) Patent No.: US 8,318,586 B2
(45) Date of Patent: Nov. 27, 2012

(54) NITROGEN-PLASMA SURFACE TREATMENT IN A DIRECT BONDING METHOD

(75) Inventors: Laure Libralesso, Vif (FR); Hubert Moriceau, Saint-Egreve (FR); Christophe Morales, St Pierre de Mesage (FR); François Rieutord, Saint-Egreve (FR); Caroline Ventosa, Fontaine (FR); Thierry Chevolleau, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/994,792

(22) PCT Filed: Apr. 28, 2009

(86) PCT No.: PCT/FR2009/000502
§ 371 (c)(1),
(2), (4) Date: Feb. 9, 2011

(87) PCT Pub. No.: WO2009/153422
PCT Pub. Date: Dec. 23, 2009

(65) Prior Publication Data
US 2011/0129986 A1 Jun. 2, 2011

(30) Foreign Application Priority Data
May 26, 2008 (FR) ...................................... 08 02833

(51) Int. Cl.
*H01L 21/30* (2006.01)
*H01L 21/31* (2006.01)

(52) U.S. Cl. .... 438/455; 438/771; 438/776; 257/E21.24
(58) Field of Classification Search ................. 438/455, 438/771, 776; 257/E21.24
See application file for complete search history.

(56) References Cited

U.S. PATENT DOCUMENTS

| 5,374,564 A | 12/1994 | Bruel |
| 5,503,704 A | 4/1996 | Bower et al. |

(Continued)

FOREIGN PATENT DOCUMENTS

EP 0 533 551 A1 3/1993

OTHER PUBLICATIONS

Amirfeiz, P. et al., "Formation of Silicon Structures by Plasma-Activated Wafer Bonding," *Journal of the Electrochemical Society*, 2000, pp. 2693-2698, vol. 147, No. 7.

(Continued)

*Primary Examiner* — Kevin Parendo
(74) *Attorney, Agent, or Firm* — Oliff & Berridge, PLC

(57) ABSTRACT

Two plates, each comprising a thin layer of silicon or silicon oxide at a surface thereof, are bonded by subjecting the thin layer of at least one of the plates to a surface treatment step forming a silicon oxynitride superficial thin film with a thickness of less than 5nm. The thin film is performed with a nitrogen-based plasma generated by an inductively coupled plasma source. Furthermore, a potential difference applied between the plasma and a substrate holder supporting said plate during the surface treatment step is less than 50 V, advantageously less than 15 V and preferably zero. This enables a defect-free bonding interface to be obtained irrespective of a temperature of any heat treatment carried out after a contacting step between the respective thin layers of the two plates.

17 Claims, 4 Drawing Sheets

U.S. PATENT DOCUMENTS

| | | | |
|---|---|---|---|
| 2004/0058497 A1* | 3/2004 | Chen et al. | 438/287 |
| 2004/0152282 A1* | 8/2004 | Tong et al. | 438/455 |
| 2005/0275067 A1* | 12/2005 | Atwater et al. | 257/616 |
| 2008/0157266 A1* | 7/2008 | Chen et al. | 257/510 |

OTHER PUBLICATIONS

Suni, T. et al., "Effects of Plasma Activation on Hydrophilic Bonding of Si and $SiO_2$," *Journal of the Electrochemical Society*, 2002, pp. G348-G351, vol. 149, No. 6.

Rieutord, F. et al., "High-Energy X-Ray Reflectivity of Buried Interfaces Created by Wafer Bonding," *Physical Review B*, 2001, pp. 125408-1-125408-5, vol. 63.

Zhu, M. et al., "Formation of Silicon on Plasma Synthesized $SiOxNy$ and Reaction Mechanism," *Applied Surface Science*, 2005, pp. 89-95, vol. 243.

Bengtsson, S. et al., "Room Temperature Wafer Bonding of Silicon, Oxidized Silicon and Crystalline Quartz," *Journal of Electronic Materials*, Sep. 19, 1999, pp. 1-27.

Kitagawa, H. et al., "Mechanism of Plasma Nitridation of Silicon Dioxide Employing Surface-Wave and Inductively Coupled Plasma Sources," *Japanese Journal of Applied Physics*, 2007, pp. 5304-5312, vol. 46, No. 8A.

International Search Report issued in International Application No. PCT/FR2009/000502 on Nov. 19, 2009 (with translation).

* cited by examiner

NITROGEN-PLASMA SURFACE TREATMENT IN A DIRECT BONDING METHOD

BACKGROUND OF THE INVENTION

The invention relates to a method for direct bonding of two plates each comprising a thin layer of silicon oxide or of silicon at the surface thereof.

STATE OF THE ART

The bonding principle by molecular adhesion or direct bonding is based on direct contacting between two surfaces, without the use of a specific material such as an adhesive, a wax, a low melting-temperature metal etc. The surfaces designed to be in contact together can be hydrophilic or hydrophobic.

Hydrophobic surfaces can for example be the free surfaces of two silicon wafers (or substrates) devoid of silicon oxide, whereas hydrophilic surfaces can for example be the free surfaces of two silicon wafers each comprising a silicon oxide thin layer.

The molecular bonding method further requires the surfaces to be bonded to be sufficiently smooth, devoid of particles or contamination, to present a suitable surface chemistry and to be sufficiently close to one another to enable a contact to be initiated. In this case, the attractive forces between the two surfaces are high enough to cause a molecular bonding.

Bonding processes are generally performed at ambient temperature and at ambient pressure, after chemical cleaning of the surfaces. However, subsequent heat treatment, for example at a temperature of about 1000° C., is often performed to enhance the bonding energies. In a very large number of applications however, heat treatment steps at such a temperature are not admissible.

Bonding methods not requiring high-temperature heat treatments have already been proposed. They generally comprise a surface activation step.

For example purposes, P. Amirfeiz et al. in the article "Formation of silicon structures by plasma-activated wafer bonding" (Journal of the Electrochemical Society, 147 (7) 2693-2698) studied the effects of activation of silicon, silicon oxide and crystal quartz by oxygen plasma or by argon plasma to achieve direct bonding at ambient temperature. The bonded structures, activated by an oxygen plasma or an argon plasma, present high surface energies comparable with those obtained for bonded structures subjected to activation by conventional wet process before bonding and to heat treatment at high temperature (between 600° C. and 800° C.) after contacting. Exposure to the oxygen plasma or to argon plasma is performed by means of a device of RIE/ICP (reactive ion etching/inductively coupled plasma) type.

In the article "Effects of Plasma Activation on Hydrophilic Bonding of Si and $SiO_2$" by T. Suni et al. (Journal of the Electrochemical Society, 149 (6) G348-G651(2002)), a reactive ion etching mode (also called RIE) is used in association with an activation by nitrogen, argon or oxygen plasma to perform a low-temperature bonding of silicon wafers. During activation, a polarization voltage varying between 125V and 280V is measured between the silicon wafers and ground. The presence of this voltage creates an acceleration of the charged species of the plasma in the direction of said wafers and bombardment of the wafer surfaces by these charged species. Furthermore, after the activation treatment and before bonding, the wafers are cleaned in a solution of RCA-1 type ($NH_3$:$H_2O_2$:$H_2O$, 70° C.) and/or in deionized water, and dried. After they have been contacted, the bonded structures are subjected to heat treatment at a temperature of 100° C. for 2 hours. The results reported in this article show that the surface energies of the structures bonded according to a method comprising a prior step of plasma treatment coupled with reactive ion etching are higher than those of structures directly bonded after chemical cleaning.

In U.S. Pat. No. 5,503,704, bonding of two surfaces is obtained by forming a nitride layer on one of the two surfaces to make the latter both hydrophilic and reactive at low temperature. When the surface material is a non-nitrogen based material, for example silicon, the nitride layer is formed by $NH_3$ plasma enhanced chemical vapor deposition (PECVD) after standard cleaning of RCA type, rinsing with deionized water and drying. The material treated in this way is then put in contact with another hydrophilic and reactive surface, and the whole is then heat treated to a temperature of about 300° C.

Although the activation techniques mentioned above enable low-temperature bonding methods to be obtained with cohesion energies at least equivalent to those of high-temperature bonding methods, they do not enable defect-free molecular bonding interfaces to be obtained. In particular, the U.S. Pat. No. 5,503,704 mentions the presence of defects in the substrate generated by deposition of the $Si_3N_4$ film.

OBJECT OF THE INVENTION

The object of the invention is to provide a method for direct bonding of two plates each comprising a thin layer of silicon oxide or of silicon at a surface thereof, so as to be able to obtain a bonding interface presenting a significantly reduced number of defects compared with bonding methods according to the prior art, and advantageously a defect-free interface, in particular whatever the temperature (in particular comprised between ambient temperature and 1300° C.) applied to the structure formed by the two bonded plates.

According to the invention, this object is achieved by the appended claims. In particular, this object is achieved by the fact that, before a contacting step of the respective thin layers of the two plates, the thin layer of at least one plate is subjected to a single surface treatment step forming a superficial thin film of silicon oxynitride with a thickness of less than 5 nm, by means of a nitrogen-based plasma generated by an inductively coupled plasma source and in the presence of a potential difference of less than 50V between the plasma and a substrate holder supporting said plate.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
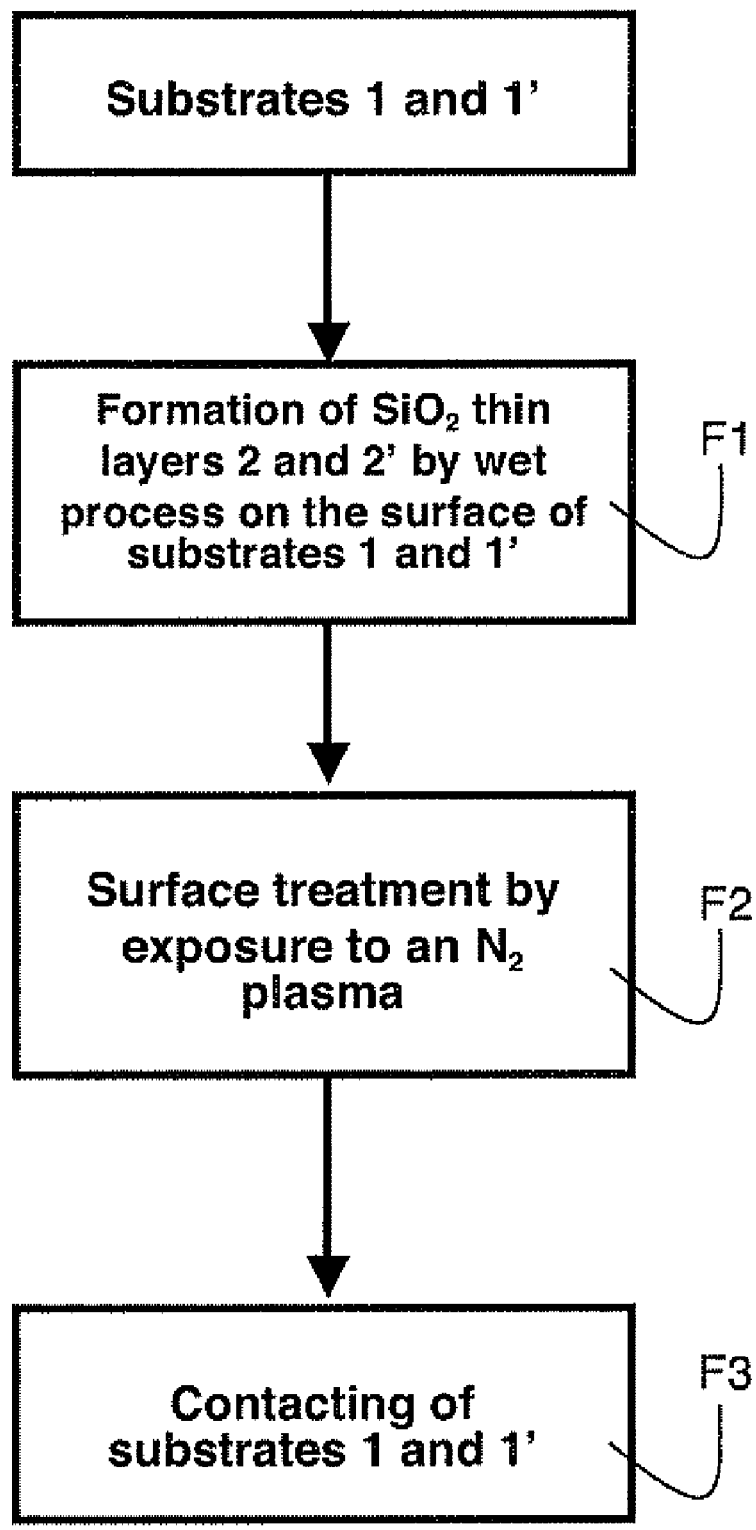
FIG. 1 represents different steps of a particular embodiment of a bonding method according to the invention in block diagram form.
Figure 2:
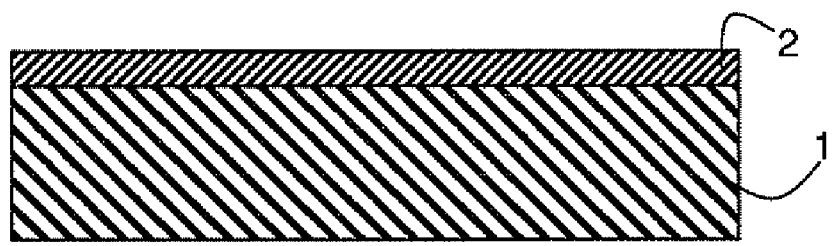
FIGS. 2 to 4 schematically represent, in cross-section, the different steps for producing a bonded structure according to the particular embodiment represented in FIG. 1.

According to a particular embodiment represented in FIGS. 1 to 4, two silicon substrates 1 and 1', also called silicon wafers, are bonded by successively performing:
- a step F1 whereby a thin layer of silicon oxide 2 and 2' is formed by wet process at the surface of substrates 1 and 1',
- a surface treatment step F2 transforming at least a part of the thin layer of silicon oxide previously formed in step F1 into a superficial thin film of silicon oxynitride 3 and 3',
- and a step F3 of contacting the two substrates 1 and 1'.

Formation of each superficial thin layer 2 and 2' is advantageously performed by cleaning of CARO type followed by cleaning of RCA type comprising a first stage of SC1 type and a second stage of SC2 type. CARO cleaning is cleaning in an acid bath called CARO($H_2SO_4+H_2O_2$). The first stage (SC1 or Standard Cleaning 1) and the second stage (SC2 or Standard Cleaning 2) of the RCA cleaning respectively consist in cleaning by means of an alkaline solution such as $NH_4OH+H_2O_2+H_2O$ and in cleaning by means of a strong oxidizing agent such as $HCl+H_2O_2+H_2O$. The thin layers of silicon oxide 2 and 2' thus formed present the advantage of being defect-free. At this stage of the method, the surface of each substrate 1 and 1' formed by the free surface of the silicon oxide layer 2 and 2' is thus hydrophilic.

Figure 3:
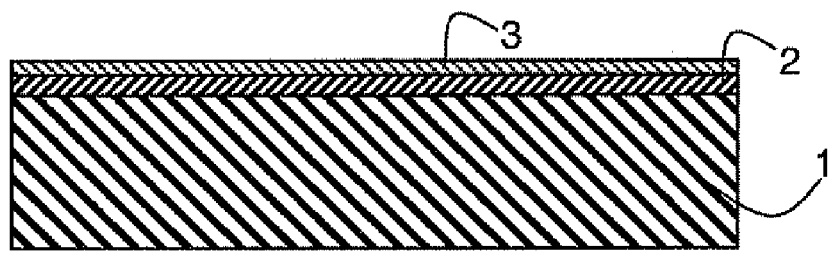

As represented in FIGS. 1 and 3, between the cleaning step F1 and the step F3 of putting the substrates 1 and 1' in contact, a single step F2 of treatment of said surfaces, also called activation step, is performed. This enables a superficial thin film 3 and 3' of silicon oxynitride, with a thickness of less than 5 nm and advantageously of about 2 nm, to be formed in the silicon oxide thin layer 2 and 2' of each substrate 1 and 1'.

For this, the free surface of the silicon oxide thin layer 2 and 2' of each substrate 1 and 1' is exposed, in a single step, to a nitrogen plasma generated by an inductively coupled plasma source (also called ICP).

Substrates 1 and 1' can be exposed to the nitrogen plasma simultaneously or successively. In the latter case, the surface treatment conditions to which the two substrates 1 and 1' are subjected can be the same or different. Furthermore, exposure of substrate or substrates 1 and 1' to the nitrogen plasma can be performed in one or more steps.

What is meant by nitrogen plasma is a pure nitrogen plasma. However, in more general manner, the plasma to which substrates 2 and 2' are exposed can also be a nitrogen-based plasma, i.e. a plasma whose reactive gas is nitrogen, which does not exclude the possibility of the presence in the plasma of a carrier gas such as argon or other gases in residual quantities. In particular, other gases can be present in the nitrogen-based plasma in small quantities in so far as they do not prevent the formation of the superficial thin film of silicon oxynitride. The plasma can for example contain oxygen, hydrogen and/or water. The concentration of these other gases is about a few percent and more particularly less than 5%.

In general manner, the silicon oxynitride superficial thin film can contain chemical species, such as hydrogen or oxygen for example, in small quantities. Thus, the general formula of the silicon oxynitride is advantageously $Si_zO_xN_yH_w$. These chemical species can be present in residual manner in the surface treatment chamber or be introduced in the form of gases in the plasma or again be present at the level of the treated superficial thin film.

Figure 4:
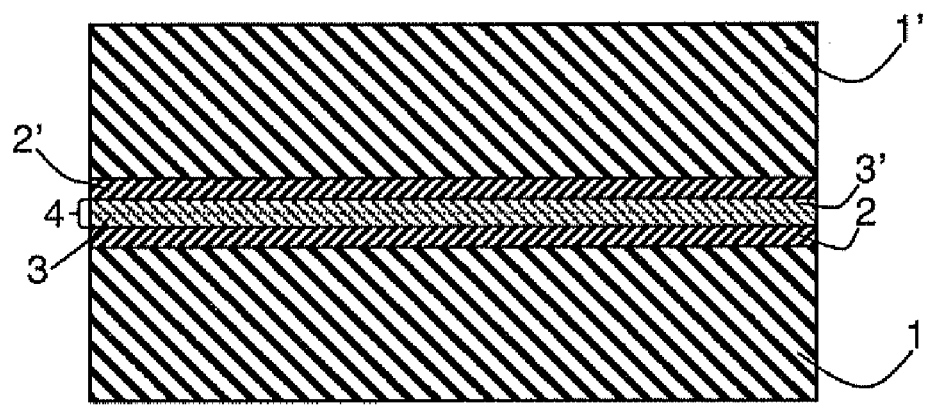

In FIGS. 3 and 4, oxynitridation of the thin layers of silicon oxide 2 and 2' is partial. The thickness of superficial thin films 3 and 3' is thereby smaller than the initial thickness of silicon oxide thin layers 2 and 2'. However, in an alternative embodiment, oxynitridation of at least one silicon oxide thin layer 2 and/or 2' can be total. Furthermore, a part of the underlying silicon can also be consumed during this step. A part of the silicon of substrates 1 and 1', located underneath silicon oxide thin layer 2 and 2', can thus also be transformed into silicon oxynitride.

Furthermore, the potential difference between the plasma and the substrate holder is small. It is in particular less than 50V, advantageously less than 15V and more particularly zero or almost zero. This potential difference corresponds in particular to a charged species energy at wafer level in particular less than 50 eV and advantageously less than 15 eV and more particularly zero or almost zero. The charged species of the nitrogen plasma or nitrogen-based plasma are therefore not accelerated towards the surface of the substrate or substrates to be processed.

According to the invention, formation of the superficial thin film of silicon oxynitride is performed in a single, short surface treatment step, by means of a single plasma (nitrogen-based plasma). This step does however enable a thin film of oxynitride with a thickness of less than 5 nm to be obtained, i.e. a film containing not only nitrogen and silicon but also oxygen. The oxygen present in the superficial thin film formed according to the invention can in particular originate from a quantity of oxygen contained in the nitrogen-based plasma and/or from the oxygen which may be present in the underlying thin layer and/or from the residual oxygen in the chamber used for performing the surface treatment step. The superficial thin film according to the invention is therefore not formed, as in the article "Formation of silicon on plasma synthesized $SiO_xN_y$ and reaction mechanism" by Ming Zhu et al. (Applied Surface Science 243 (2005) 89-95) in two successive steps respectively consisting of nitridation (by means of a nitrogen plasma), and then of oxidation (for example by means of an oxygen plasma). This enables a fine silicon oxynitride to be obtained presenting an interface with the silicon having good electronic properties and a good surface nitration. In the article by Ming Zhu et al, however, it is proposed to produce a silicon oxynitride with a thickness of about 80 nm to replace the buried oxide of a silicon on insulator (SOI) substrate and to improve the heat dissipation by the substrate.

Furthermore, by choosing a potential difference between the plasma and substrate holder of less than 50V, advantageously less than 15V and preferably zero, the number of defects present at the bonding interface is considerably reduced or even zero.

Finally, step F3 represented in FIG. 1 consists in putting the free surfaces of the two superficial thin films 3 and 3' in direct contact. This step can be performed in situ, i.e. in the chamber where the surface treatment of step F2 is performed, or it can be performed ex situ. This step F3 can further be performed directly after step F2, i.e. without any intermediate step between the two steps F2 and F3. In alternative embodiments, one or more intermediate steps can be performed between steps F2 and F3, for example to remove the particles or any contamination (metallic or hydrocarbon or such like) that may have been deposited during step F2 or subsequent to step F2. These intermediate steps can for example comprise surface treatment steps which can be chemical or steps conventionally used in the microelectronics field. For example purposes, substrates 1 and 1', provided with superficial thin films 3 and 3', can be immersed in a megasonic-assisted chemical bath or not megasonic-assisted chemical bath, or they can be subjected to one or more brushing operations, one or more heat treatments in a controlled atmosphere and/or one or more ultraviolet radiation/ozone treatments.

In the embodiment represented in FIGS. 1 to 4, bonding of two bulk silicon substrates is performed by forming a superficial thin film of silicon oxynitride 3 and 3' at the surface of each of the two substrates. However, the bonding method according to the invention is not limited to the embodiment represented in FIGS. 1 to 4.

In particular, in the specific embodiment represented in FIGS. 1 to 4, superficial thin layers of silicon oxide are formed at the surface of substrates 1 and 1' by wet process and in particular by a wet process cleaning step. However, at least one of the superficial thin layers of silicon oxide can be formed by other techniques, either alone or in combination. It can for example be formed by thermal oxidation. It can also be formed by deposition such as chemical vapor deposition (CVD), ion beam sputtering (IBS) or by inductively coupled plasma deposition (ICP). It can also be a thin layer of native silicon oxide, for example created by RCA treatment or by UV radiation-ozone treatment or by ozonized water treatment. Contacting of the two substrates or two wafers can thus for example be achieved with the combinations of following initial silicon oxide superficial thin layers:

- $SiO_2$ obtained by wet process to be bonded on $SiO_2$ obtained by wet process,
- native $SiO_2$ to be bonded on $SiO_2$ obtained by wet process,
- native $SiO_2$ to be bonded on native $SiO_2$,
- thermal $SiO_2$ (for example a thin layer with a thickness of about 2.5 nm to about 1 micrometer) to be bonded on $SiO_2$ obtained by wet process and
- thermal $SiO_2$ (for example a thin layer with a thickness of about 2.5 nm to about 25 nm) to be bonded on native $SiO_2$.
- thermal $SiO_2$ (for example a thin layer with a thickness of about 2.5 nm to about 25 nm) to be bonded on thermal $SiO_2$ (for example a thin layer with a thickness of about 2.5 nm to about 25 nm).

Furthermore, bonding can also be achieved by forming a single superficial thin film of silicon oxynitride at the surface of one of the two silicon substrates 1 only. In this case, before the contacting step, the surface of the other substrate 1', designed to come into contact with the silicon oxynitride superficial thin film 2 of substrate 1, can be rendered hydrophilic by creating a superficial thin layer of silicon oxide, or it can be rendered hydrophobic.

Indeed, although the embodiment represented in FIGS. 1 to 4 consists in bonding two hydrophilic surfaces, direct bonding using activation by nitrogen-based plasma can also be performed with at least one hydrophobic surface. The hydrophobic surface can thus be the free surface of one of the substrates that is not subjected to the nitrogen-based plasma activation step, when a single superficial thin film of silicon oxynitride is formed at the surface of one of the two substrates only. The hydrophobic surface can also be the free surface of the or of at least one of the substrates designed to be subjected to the nitrogen-based plasma activation step. In this case, it is the silicon-free surface of the substrate that is exposed to the nitrogen-based plasma generated by an inductively coupled plasma source. Furthermore, in this case, a small quantity of oxygen or water, for example present in the plasma or in residual manner in the frame structure, is necessary for a silicon oxynitride film to be able to be created at the surface of the silicon substrate. In both cases, a silicon surface can be rendered hydrophobic by performing CARO cleaning, RCA cleaning and cleaning with hydrofluoric acid (HF) in liquid or vapor form. This last cleaning phase then eliminates the silicon oxide layer created when CARO and RCA cleaning are performed.

Finally, the substrates do not necessarily need to be bulk silicon substrates. Thus, in alternative embodiments, at least one of the substrates can be replaced by a plate comprising a silicon thin layer and/or a silicon oxide thin layer on the surface thereof. For example purposes, the plate can be formed by a different semi-conductor material from silicon, in particular germanium, by a glass or by a metal, and it comprises a thin layer of silicon or silicon oxide on the surface thereof. The thickness of the silicon or silicon oxide thin layer is preferably comprised between a few nanometers and a few micrometers. For example purposes, a germanium substrate can comprise a silicon and/or of silicon oxide thin layer with a thickness comprised between 3 and 5 mm and advantageously of 3 mm on the surface thereof.

In all cases, once the substrates (or plates) have been put in contact, the bonding interface formed by at least one silicon oxynitride superficial thin film presents a considerably smaller number of defects compared with bonding methods according to the prior art. The bonding interface is advantageously defect-free. In particular it does not contain any bubbles. This interface furthermore remains of good quality with time, even when the bonded structure is subjected to heat treatment at any temperature ranging from ambient temperature up to 1300° C.

The quality of the bonding interface is further improved when the operating conditions of the activation step (step F2 in FIG. 1) enable a silicon oxynitride thin film to be obtained presenting:

- an atomic percentage of nitrogen of more than a few percent (for example 5%), in particular more than 15% and preferably more than 30% and less than 65% and more particularly less than 50%,
- an electron densification corresponding to the value of $$\Delta \rho / \rho_{Si} = \frac{\rho - \rho_{Si}}{\rho_{Si}},$$

where $\rho$ represents the electron density of the silicon oxynitride and $\rho_{Si}$ represents the electron density of the silicon, more than 10%, preferably more than 15% and even more preferably more than 18%, for its maximum value over the thickness of the layer,

- a thickness of more than 0.1 nm and advantageously more than or equal to 1 nm,
- very low surface and volume concentrations of —OH bonds,
- significant surface and volume concentrations of —NH bonds.

To obtain a superficial thin film of silicon oxynitride with the above-properties, the operating conditions to perform the activation step by nitrogen plasma are advantageously the following:

The substrate or substrates are placed in the ICP chamber.
The pressure inside the chamber before the surface treatment is preferably lower than $10^{-3}$ millitorr (mT), i.e. about 0.1333 mPa.

Plasma activation is performed with a nitrogen partial pressure lower than or equal to 40 mT (i.e. about 5.33 Pa) and advantageously about 5 mT (i.e. about 0.66 Pa), for a very short time. The nitrogen partial pressure during the surface treatment is thus preferably lower than or equal to 0.6 Pa and advantageously lower than or equal to 1 Pa. Furthermore, the time of the surface treatment is advantageously less than 5 minutes and preferably less than 2 minutes. It is in particular comprised between 30 seconds and 90 seconds.

The temperature of the substrate holder designed to support the substrate or substrates to be processed is advantageously higher than the ambient temperature. The substrate holder can thus be kept at a fixed temperature the value of which is comprised in the 150° C.-350° C. range.

The inductively coupled plasma source comprises a radiofrequency power generator having a power which can be a few hundred watts preferably between 500 W and 800 W.

For illustration purposes, tests were carried out with silicon substrates with a thickness of 750 microns and a diameter of 200 mm initially presenting a hydrophilic free surface (wetting angle of a water droplet <5°). Examples 1 to 7, operating conditions of which are set out in the table below, therefore each correspond to a bonding process between two substrates subjected both to cleaning and to exposure in a nitrogen plasma generated under various conditions by an ICP source before contacting.

The chamber in which the surface treatment is performed for examples 1 to 7 is a device marketed by Applied Materials under the name AMAT Centura DPS+. Moreover, for all the examples 1 to 7, the operating conditions set out below were applied:

potential difference between the substrate holder and ground: zero
pressure in the chamber before the plasma activation step: $10^{-3}$ mT
nitrogen partial pressure during the plasma activation step: 5 mT
nitrogen flux during the plasma activation step: 100 sccm.

|  | Ex 1 | Ex 2 | Ex 3 | Ex 4 | Ex 5 | Ex 6 | Ex 7 |
|---|---|---|---|---|---|---|---|
| Type of cleaning | Caro + RCA (SC1 + SC2) | Caro + RCA (SC1 + SC2) | Caro + RCA (SC1 + SC2) | Caro + RCA (SC1 + SC2) + HF | Caro + RCA (SC1 + SC2) | Caro + RCA (SC1 + SC2) | Caro + RCA (SC1 + SC2) |
| RF source power (in W) | 800 | 800 | 800 | 800 | 500 | 800 | 800 |
| T° of the substrate holder (in ° C.) | 250° C. | 250° C. | 250° C. | 250° C. | 250° C. | 150° C. | 350° C. |
| Exposure time (in s) | 60 | 30 | 90 | 60 | 60 | 60 | 60 |

Before the plasma activation step, all the substrates were cleaned with Caro cleaning followed by RCA cleaning (SC1 and SC2). The substrates of example 4 were on the other hand then subjected to hydrofluoric acid treatment to obtain a hydrophobic surface and removal of oxide at the surface. The other surface treatment conditions in example 4 are identical to those of example 1. The operating conditions of examples 2 and 3 are identical to those of example 1 with the exception of the exposure time of the substrates to the nitrogen plasma, which is 60 s in example 1, 30 s in example 2 and 90 s in example 3. The operating conditions of example 5 are identical to those of example 1 with the exception of the power of the radiofrequency generator which is 500 W in example 5 and 800 W in example 1. The operating conditions of examples 6 and 7 are identical to those of example 1 with the exception of the temperature of the substrate holder which is 250° C. in example 1, 150° C. in example 6 and 350° C. in example 7.

The superficial thin films formed in the substrates and the bonding interfaces obtained after two substrates have been brought into contact were characterized by different analysis techniques such as X-ray photoemission spectroscopy (XPS), X-ray reflectivity (XRR), Fourier transform infrared spectroscopy (FTIR) and scanning acoustic microscopy (SAM).

The different analyses performed prove the presence of a nitrided silicon oxide film. The composition of the films obtained in examples 1 and 4 were characterized by X-ray photoemission spectroscopy (XPS) coupled with the plasma treatment chamber. The measurements made for the substrates processed according to example 1 revealed the presence of a thin film of $Si_{48}N_{38}O_{14}$ (only the majority species Si, O and N were quantified) that is stable in time. For example 4, the measurements also revealed the presence of a thin film of $Si_{48}N_{45}O_7$ that is stable in time.

Figure 5:
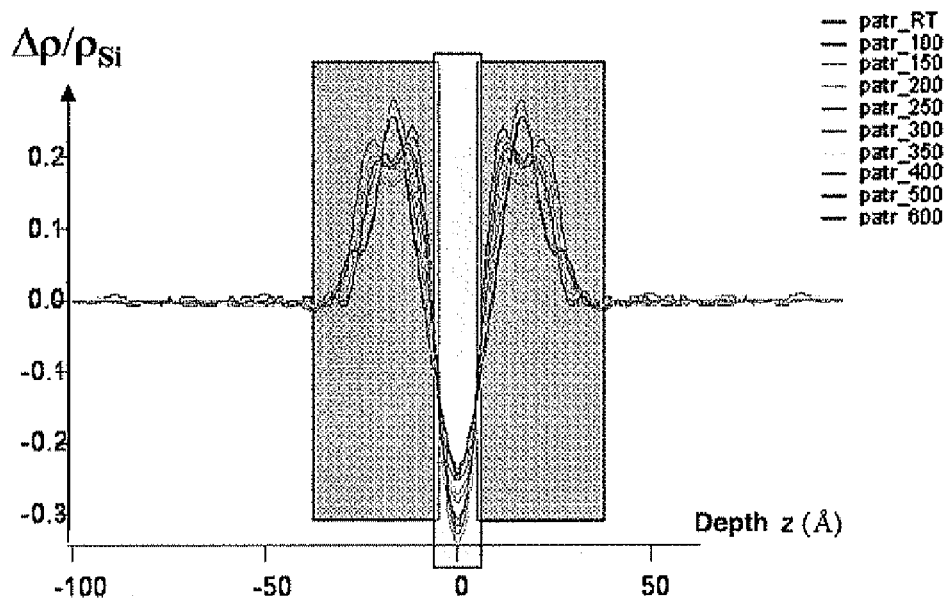
FIGS. 5 and 6 respectively represent the variation of $\Delta\rho/\rho_{Si}$ versus the depth z, at ambient temperature, in a bonded structure of two silicon wafers, obtained by a particular embodiment of bonding according to the invention and by a bonding method according to the prior art.
Figure 6:
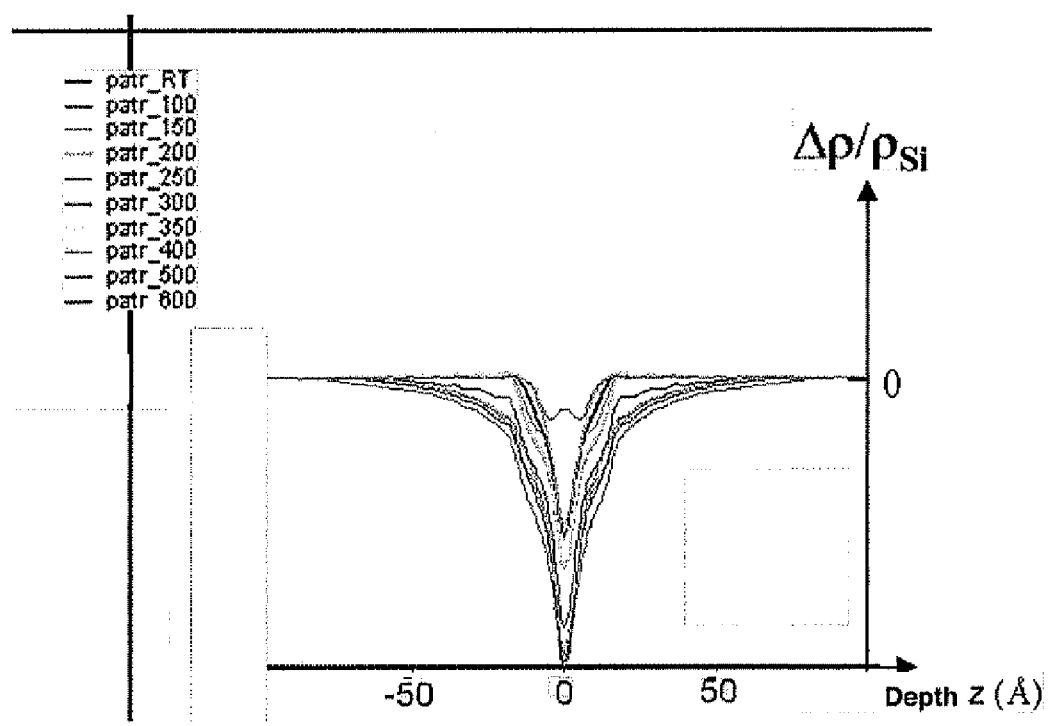

Analyses by high-resolution X-ray reflectivity (HR-XRR) enable it to be determined that, for examples 1 and 2, the silicon oxynitride thin film of each substrate has a thickness of about 2 nm. An increase of the electron density of the film formed during exposure to the nitrogen plasma can also be observed compared with the density of silicon. For example purposes, the maximum value $\Delta\rho/\rho_{Si}$ of the film formed in example 1 is at least 18% whereas in example 2 it is at least 20%. This increase of the electron density is in particular illustrated in FIGS. 5 and 6 which correspond to the variation of $\Delta\rho/\rho_{Si}$ versus depth z in a bonded structure with two silicon substrates respectively obtained by a bonding method according to example 1 and by a bonding method according to the prior art comprising the same conditions as those of example 1 for the cleaning step but without the plasma activation step being performed. The electron density values $\rho$ versus the depth and for different temperatures are obtained by X-ray reflectivity (XRR) as reported in the article "High-energy x-ray reflectivity of buried interfaces created by wafer bonding" by F. Rieutord et al. (Physical review B, Volume 63, 125408). FIG. 5 also enables the thickness of each film to be measured.

Furthermore, for all the films formed according to examples 1 to 7, analysis by scanning acoustic microscopy (SAM with lateral resolution of about ±30 μm) enables it to be observed that the bonding interface of two bonded substrates does not present any defects (absence of bubbles) and is stable in temperature, whatever the temperature of any anneal that may be performed after bonding and in particular in a temperature range ranging from ambient temperature up to 1300° C.

Figure 7:
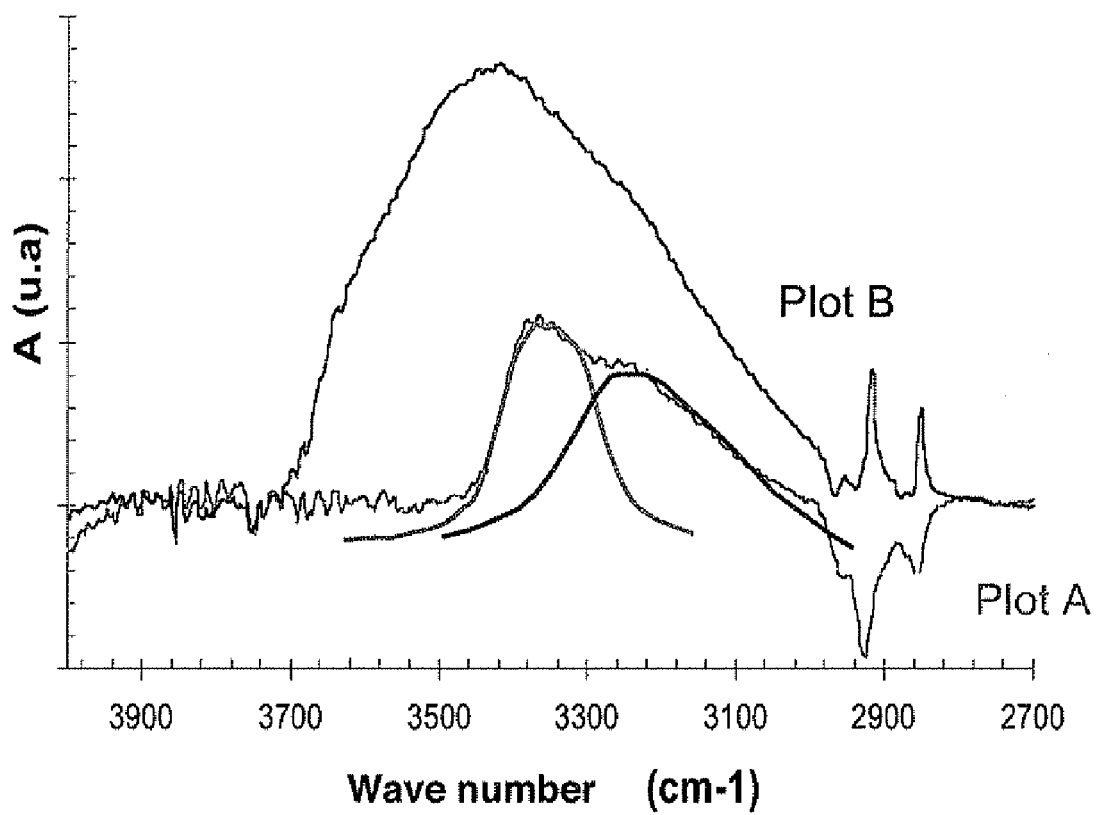
FIG. 7 represents the infrared spectrum of a silicon oxynitride thin film formed in a particular embodiment according to the invention and the infrared spectrum of a silicon oxide thin film formed in a bonding method according to the prior art, at ambient temperature.

The absence of —OH surface and volume bonds for all the films produced according to examples 1 to 7 and the presence of —N—H bonds are observed by FTIR-MIR spectroscopy. For example purposes, FIG. 7 represents the FTIR spectrum (plot A) at ambient temperature of the silicon oxynitride thin film formed in example 1 and the FTIR spectrum (plot B) of a silicon oxide film formed during a bonding method according to the prior art (under the cleaning conditions of example 1 but without activation with a nitrogen plasma).

Activation by nitrogen plasma, controlled in ICP mode with a low or even advantageously zero potential difference between the plasma and the substrate holder and ground, is thus a surface treatment technique whereby bonds can be obtained that do not present any bonding defects in a wide post-bonding annealing temperature range.

Activation by nitrogen plasma, controlled in ICP mode has already been used in other fields to produce silicon oxynitride films. For example, the article "Mechanism of Plasma Nitridation of Silicon Dioxide Employing Surface-Wave and Inductively Coupled Plasma Sources" by Hideo Kitagawa (Japanese Journal of Applied Physics, Vol 46, n° 8A, 2007, pp 5304-5312) reports the use of this surface treatment to produce silicon oxynitride films as gate dielectrics in MOSFET transistors.

According to the invention on the other hand, such a surface treatment is used in a bonding process of two plates and, by associating it with a low or zero potential difference between the substrate holder and the plasma, it enables the defect ratio of the bonding interface to be significantly improved (absence of defects whatever the post-bonding annealing temperature). In particular this improvement is obtained by the creation of at least one silicon oxynitride superficial thin film with a thickness of at least a few tenths of a nanometer and less than 5 nm, which enables the electron density (electron densification) in the plates subsurface to be increased.

Moreover, the bonding method according to the invention can advantageously be applied conjointly to a method used for producing bonded silicon on insulator (SOI) substrates and comprising a gas ion implantation step before the two substrates are brought into contact. Such a method, also known under the name of "SmartCut™", is described in European Patent application EP-A-0533551. The bonding method according to the invention can also be applied conjointly to a process called BESO™ (respectively BSOI), standing for "Bond- and Etch-Back Silicon on Insulator" (respectively "Bonded Silicon on Insulator") whereby stacked structures with single-crystal layers can for example be produced on buried oxide layers.

The invention claimed is:

1. A method for direct bonding of two plates, each of the two plates comprising a thin layer selected from the group consisting of a silicon oxide thin layer and a silicon thin layer at a surface thereof,
wherein
before a contacting step between the respective thin layers of the two plates, the thin layer of at least one plate of the two plates is subjected to a single surface treatment step forming a superficial thin film of silicon oxynitride with a thickness of less than 5 nm, and
the single surface treatment step is performed with a nitrogen-based plasma generated by an inductively coupled plasma source and in the presence of a potential difference of less than 15 V between the plasma and a substrate holder supporting the at least one plate.

2. The method according to claim 1, wherein the potential difference is zero.

3. The method according to claim 1, wherein the single surface treatment step is performed during a time less than 5 minutes.

4. The method according to claim 3, wherein the time of the single surface treatment step is between 30 seconds and 90seconds.

5. The method according to claim 1, wherein the substrate holder is kept at a temperature between 150° C. and 350° C. during the single surface treatment step.

6. The method according to claim 1, wherein the single surface treatment step is performed with a nitrogen partial pressure less than or equal to 6 Pa.

7. The method according to claim 6, wherein the nitrogen partial pressure during the single surface treatment step is less than or equal to 1 Pa.

8. The method according to claim 1, wherein at least one of the two plates comprises the silicon oxide thin layer, and the silicon oxide thin layer is a thin layer of native silicon oxide.

9. The method according to claim 1, wherein at least one of the two plates comprises the silicon oxide thin layer, and the silicon oxide thin layer is formed by wet process.

10. The method according to claim 1, wherein one of the two plates comprises the silicon oxide thin layer, and the silicon oxide thin layer is formed by thermal oxidation.

11. The method according to claim 1, wherein one of the two plates comprises the silicon oxide thin layer, and the silicon oxide thin layer is formed by deposition.

12. The method according to claim 1, wherein at least one of the two plates is a semi-conductor substrate.

13. The method according to claim 12, wherein the semi-conductor substrate is germanium-based.

14. A method for direct bonding of two plates, each of the two plates comprising thin layer selected from the group consisting of a silicon oxide thin layer and a silicon thin layer at a surface thereof,
wherein
before a contacting step between the respective thin layers of the two plates, the thin layer of at least one of the two plates is subjected to a single surface treatment step forming a superficial thin film of silicon oxynitride with a thickness of less than 5 nm,
the single surface treatment step is performed with a nitrogen-based plasma generated by an inductively coupled plasma source and in the presence of a potential difference of less than 50 V between the plasma and a substrate holder supporting said at least one plate, and
a nitrogen-based plasma gas comprises at least 95% nitrogen.

15. The method according to claim 14, wherein the potential difference is less than 15 V.

16. The method according to claim 14, wherein the single surface treatment step is performed during a time between 30 seconds and 90 seconds.

17. The method according to claim 14, wherein the single surface treatment step is performed with a nitrogen partial pressure less than or equal to 1 Pa.

* * * * *